US010170317B1

(12) United States Patent
Huang et al.

(10) Patent No.: US 10,170,317 B1
(45) Date of Patent: Jan. 1, 2019

(54) SELF-PROTECTIVE LAYER FORMED ON HIGH-K DIELECTRIC LAYER

(71) Applicant: Taiwan Semiconductor Manufacturing Co., Ltd., Hsinchu (TW)

(72) Inventors: Ju-Li Huang, Mingjian Township (TW); Ying-Liang Chuang, Zhubei (TW); Ming-Hsi Yeh, Hsinchu (TW); Kuo-Bin Huang, Jhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/718,565

(22) Filed: Sep. 28, 2017

(51) Int. Cl.
| | |
|---|---|
| H01L 29/49 | (2006.01) |
| H01L 21/28 | (2006.01) |
| H01L 27/092 | (2006.01) |
| H01L 29/51 | (2006.01) |
| H01L 21/8238 | (2006.01) |
| H01L 29/66 | (2006.01) |

(52) U.S. Cl.
CPC .. *H01L 21/28247* (2013.01); *H01L 21/28088* (2013.01); *H01L 21/823821* (2013.01); *H01L 21/823842* (2013.01); *H01L 21/823857* (2013.01); *H01L 27/0924* (2013.01); *H01L 29/4966* (2013.01); *H01L 29/517* (2013.01); *H01L 29/66545* (2013.01)

(58) Field of Classification Search
CPC ................................................. H01L 27/0924
See application file for complete search history.

(56) References Cited

U.S. PATENT DOCUMENTS

| | | | |
|---|---|---|---|
| 9,236,446 B2 | 1/2016 | Liu et al. | |
| 9,337,303 B2 | 5/2016 | Jangjian et al. | |
| 9,431,304 B2 | 8/2016 | Huang et al. | |
| 9,570,580 B1 | 2/2017 | Chiang et al. | |
| 9,761,684 B2 | 9/2017 | Huang et al. | |
| 2013/0017679 A1 | 1/2013 | Lenski et al. | |
| 2015/0303305 A1 | 10/2015 | Ching et al. | |
| 2016/0181163 A1* | 6/2016 | Huang | H01L 21/823857 257/369 |

OTHER PUBLICATIONS

Khalafi-Nezhad et al.; Silica boron-sulfuric acid nanoparticles (SBSANs): preparation, characterization and their catalytic application in the Ritter reaction for the synthesis of amide derivatives; J. Mater. Che., 2011, 21, pp. 12842-12851.
Textor et al; Structural Chemistry of Self-Assembled Monolayers of Octadecylphosphoric Acid on Tantalum Oxide Surfaces; Langmuir 2000, 16 pp. 3257-3271.

* cited by examiner

*Primary Examiner* — Asok K Sarkar
*Assistant Examiner* — Grant S Withers
(74) *Attorney, Agent, or Firm* — Slater Matsil, LLP

(57) ABSTRACT

Semiconductor device structures having metal gate structures with tunable work function values are provided. In one example, a first gate structure and a second gate structure formed on a substrate, wherein the first gate structure includes a first work function metal having a first material, and the second gate structure includes a second work function metal having a second material, the first material being different from the second material, wherein the first gate structure further includes a gate dielectric layer, a self-protective layer having metal phosphate, and the first work function metal on the self-protective layer.

20 Claims, 15 Drawing Sheets

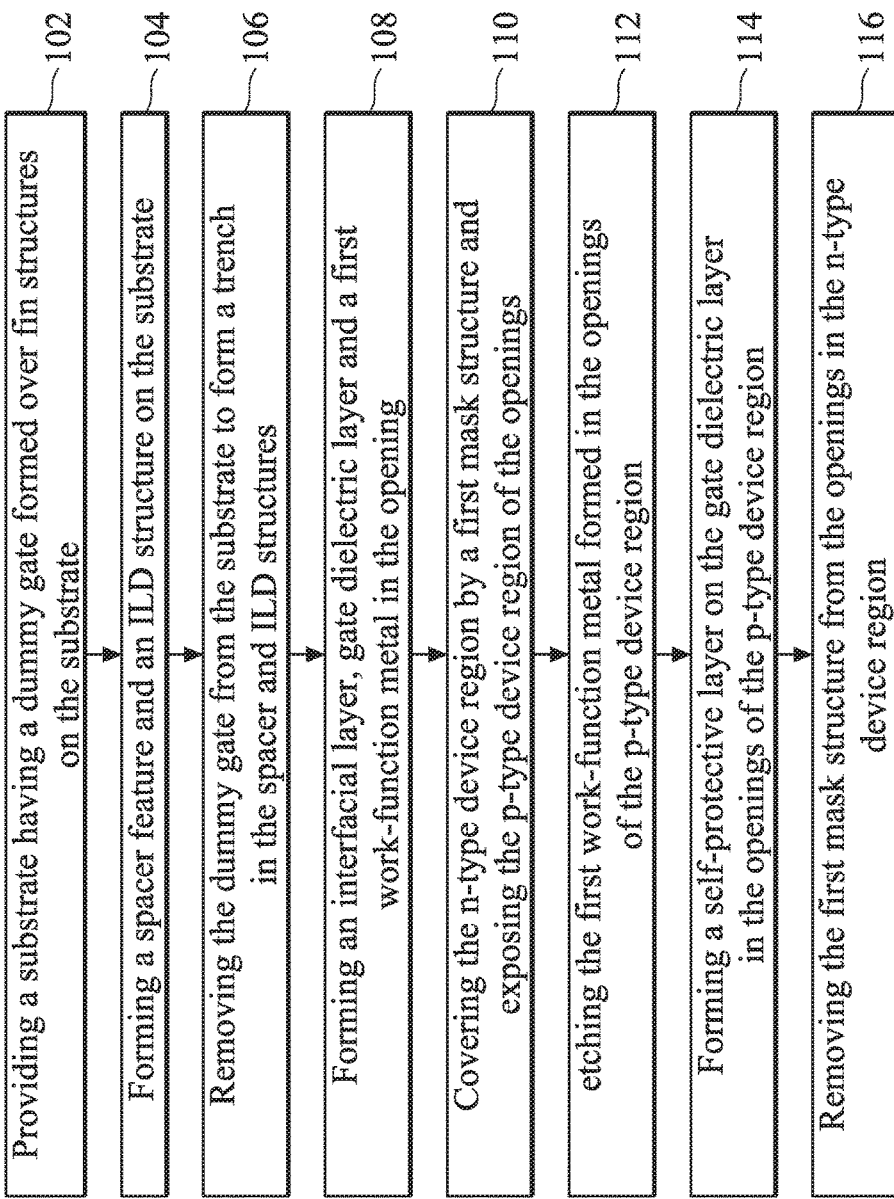

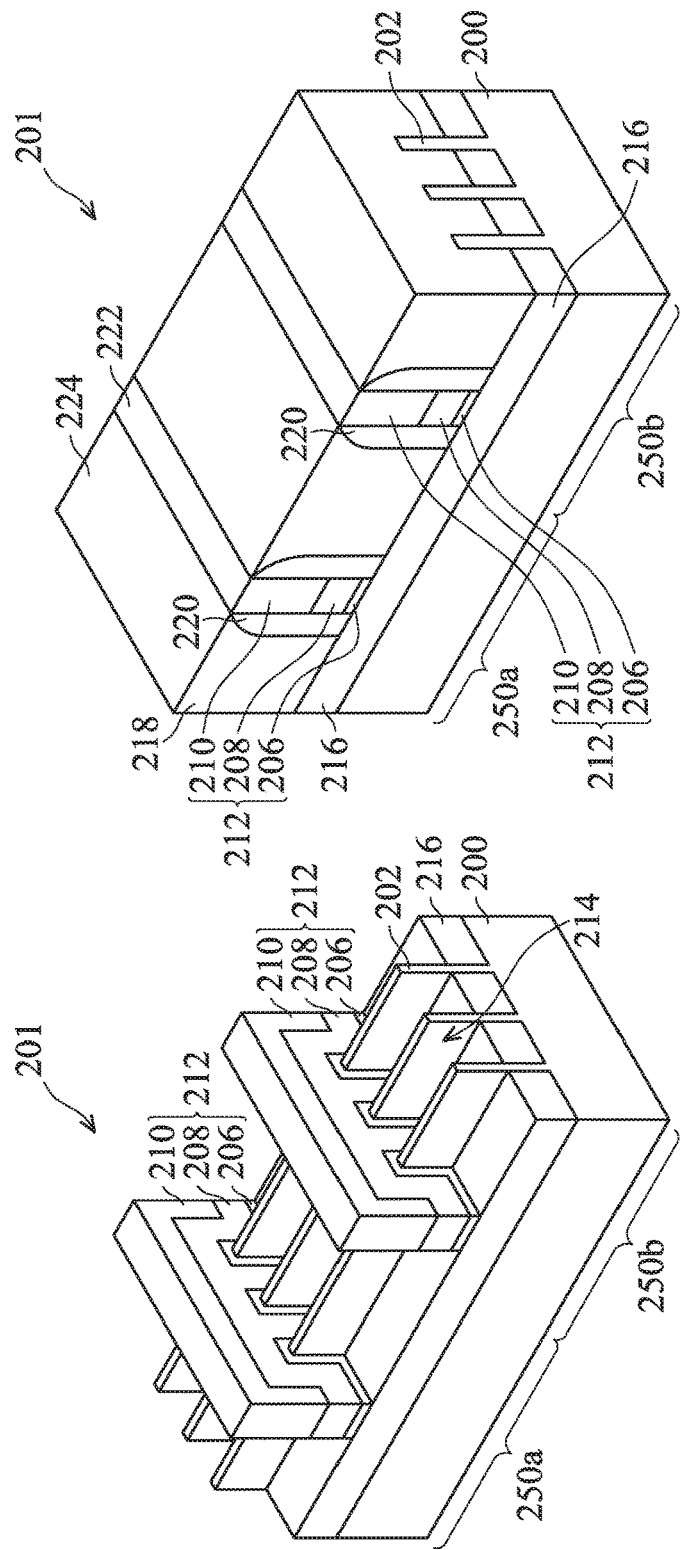

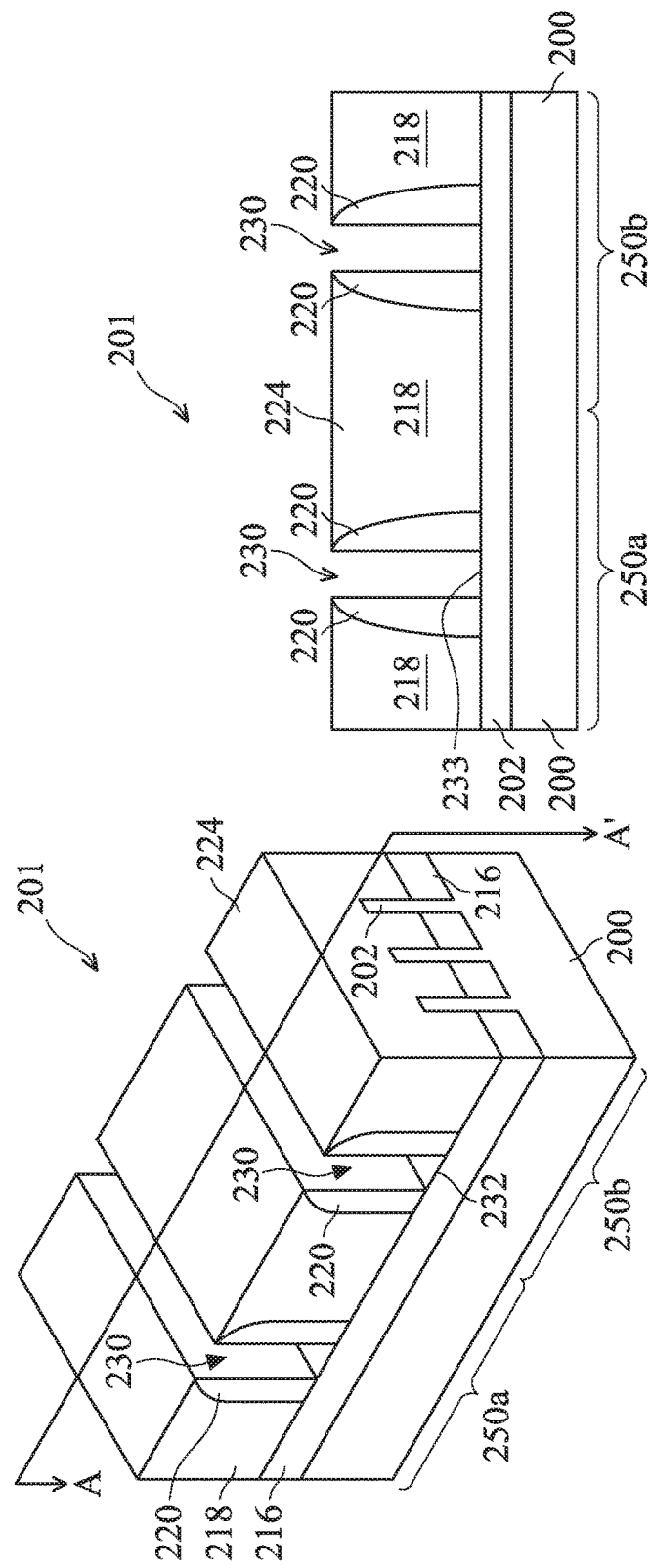
FIG. 2C2
FIG. 2C1

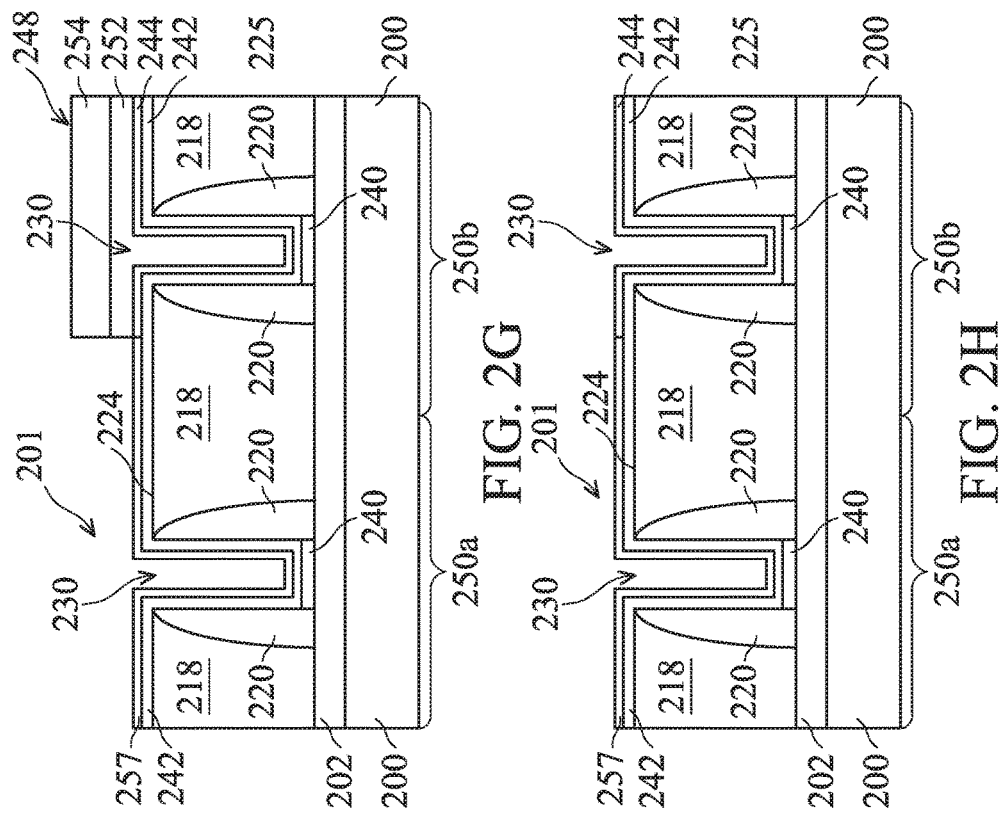

SELF-PROTECTIVE LAYER FORMED ON HIGH-K DIELECTRIC LAYER

BACKGROUND

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI technology have placed additional demands on processing capabilities. Reliable formation of gate structures on the substrate is important to VLSI and ULSI success and to the continued effort to increase circuit density and quality of individual substrate and die.

As the semiconductor industry has progressed into nanometer technology process nodes in pursuit of higher device density, higher performance, and lower costs, challenges from both fabrication and design have resulted in the development of three dimensional designs, such as fin field effect transistors (FinFETs). A typical FinFET is fabricated with a fin structure extending from a substrate, for example, by etching into a silicon layer of the substrate. The channel of the FinFET is formed in the vertical fin. A gate structure is provided over (e.g., overlying to wrap) the fin structure. It is beneficial to have a gate structure on the channel allowing gate control of the channel around the gate structure. FinFET devices provide numerous advantages, including reduced short channel effects and increased current flow.

As the device dimensions continue scaling down, FinFET device performance can be improved by using a metal gate electrode instead of a typically polysilicon gate electrode. One process of forming a metal gate stack is forming a replacement-gate process (also called as a "gate-last" process) in which the final gate stack is fabricated "last". However, there are challenges to implement such IC fabrication processes in advanced process nodes with complex surface topology. Inaccurate and improper control of the deposition and patterning process during the gate fabrication may adversely deteriorate electrical performance of the device structures.

Thus, there is a desire to manufacture the device structures with desired electrical performance and good interface control.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A-1B is a flow chart of an exemplary process for manufacturing a device structure on a substrate in accordance with some embodiments;

FIGS. 2A-2C1 depict perspective views of a semiconductor device structure at different manufacturing stages of FIG. 1A-1B in accordance with some embodiments;

FIGS. 2C2-2O depict cross-sectional views of the semiconductor device structure at different manufacturing stages of FIG. 1A-1B in accordance with some embodiments.

DETAILED DESCRIPTION

Figure 1B:
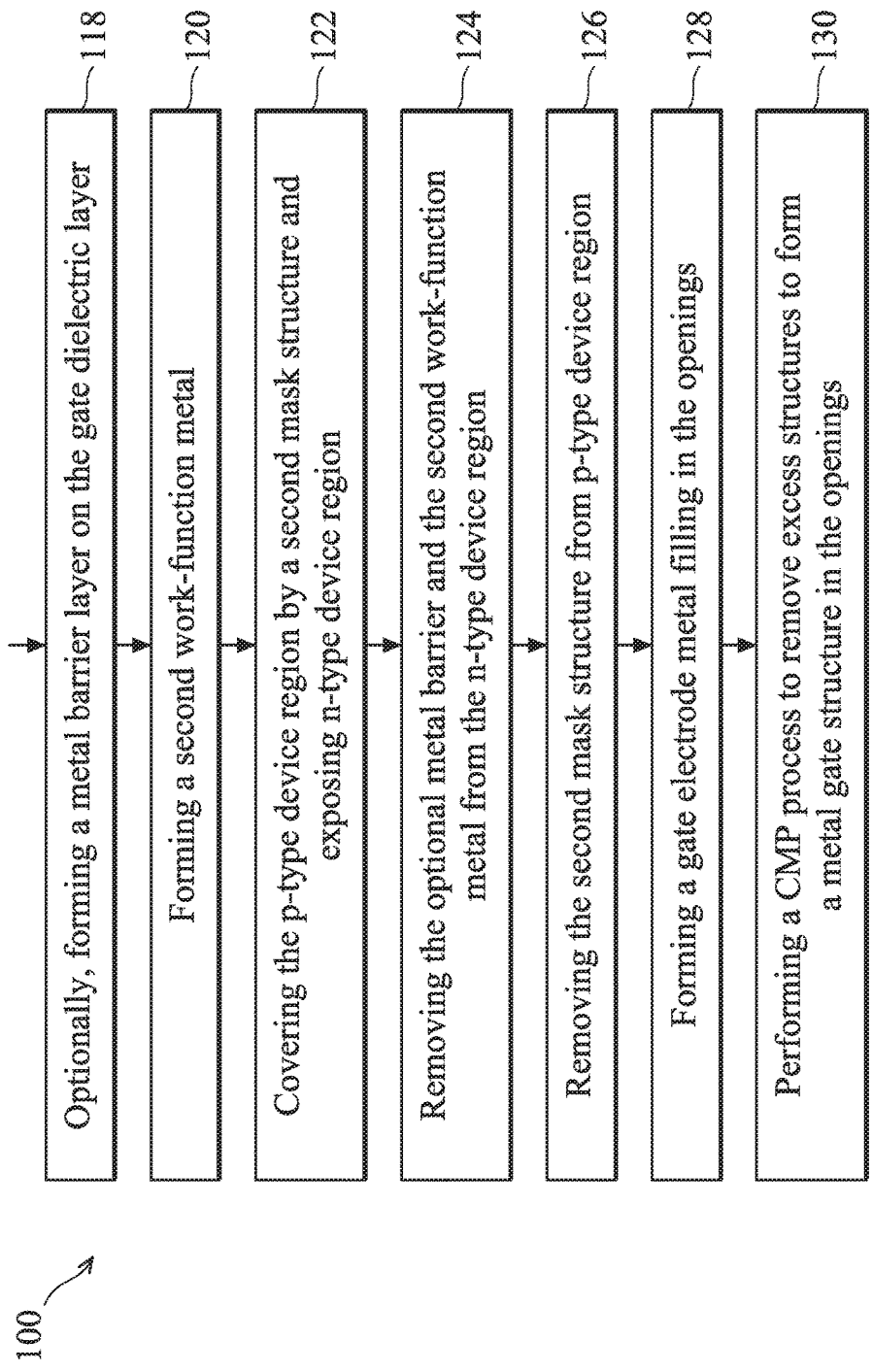

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to replacement gates formed in semiconductor devices. The present disclosure provides methods for and structures of protective layer(s) that protect a gate dielectric layer formed in the gate structures in a replacement gate manufacturing processes. Some examples described herein are in the context of FinFETs. In other implementations, replacement gates and processes in accordance with some embodiments may be implemented in vertical, gate all around (VGAA) devices, horizontal, gate all around (HGAA) devices, or other devices. Further, embodiments may be implemented in any advanced technology nodes.

In a replacement gate process for forming a metal gate for a transistor, a dummy gate stack is formed over a substrate as a placeholder for an actual gate stack later formed thereon. A spacer structure is formed surrounding the dummy gate stack. After source/drain features and an interlayer dielectric (ILD) are formed adjacent to the spacer structure, the dummy gate stack is removed, leaving an opening surrounded by the spacer structure and ILD. Then, a metal gate is formed in the opening defined by the spacer structure and ILD.

The metal gate structure includes a gate dielectric layer such as a high-k dielectric layer, an optional barrier layer, a work function metal layer, and a gate metal electrode. Multiple deposition and patterning processes may be used to form the work function metal layer, for example, to fine tune threshold voltage (Vt) of the transistor. In some embodiments, the work function metal layer may utilize different materials for different types of transistors, such as p-type FinFET or n-type FinFET, so as to enhance device electrical performance as needed. The barrier layer is optionally used to protect the gate dielectric layer during the patterning processes. However, the gate dielectric layer and the optional barrier layer may be inadvertently etched by some cleaning and/or etching processes. As a result, the gate dielectric layer and the optional barrier layer may lose its effectiveness and functions in the metal gate structure. Embodiments of the present disclosure may address such an issue.

Figure 2D:
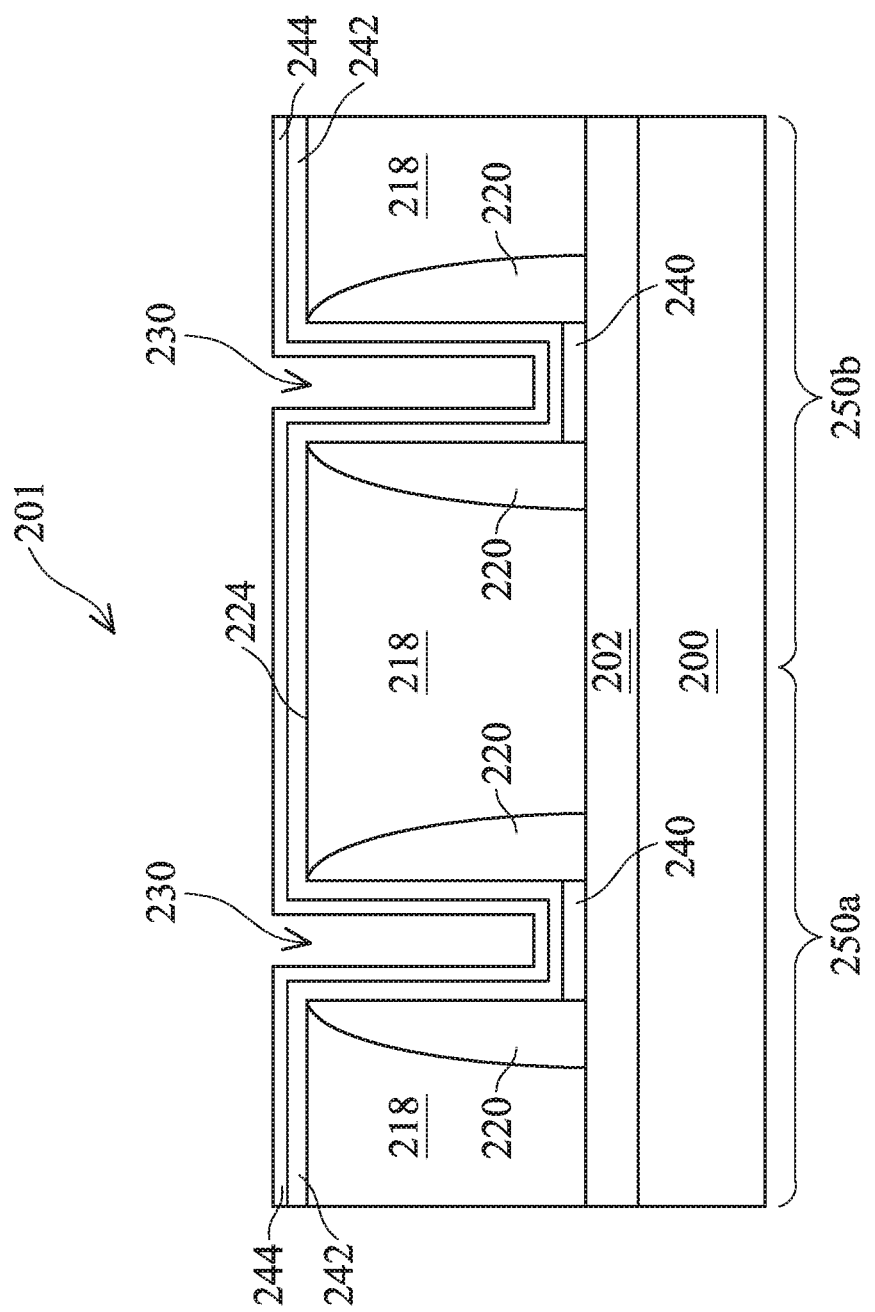
Figure 2E:
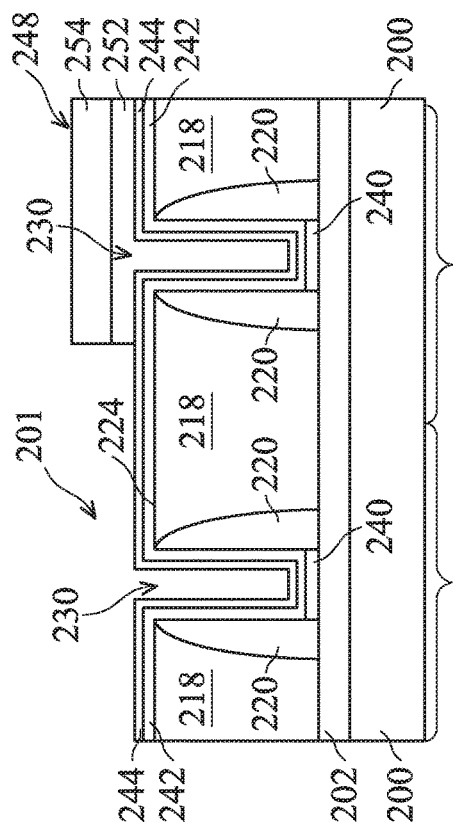
Figure 2F:
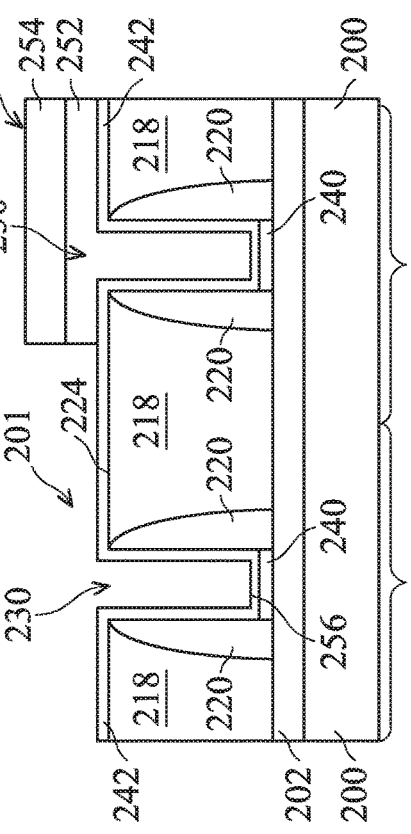
Figure 2I:
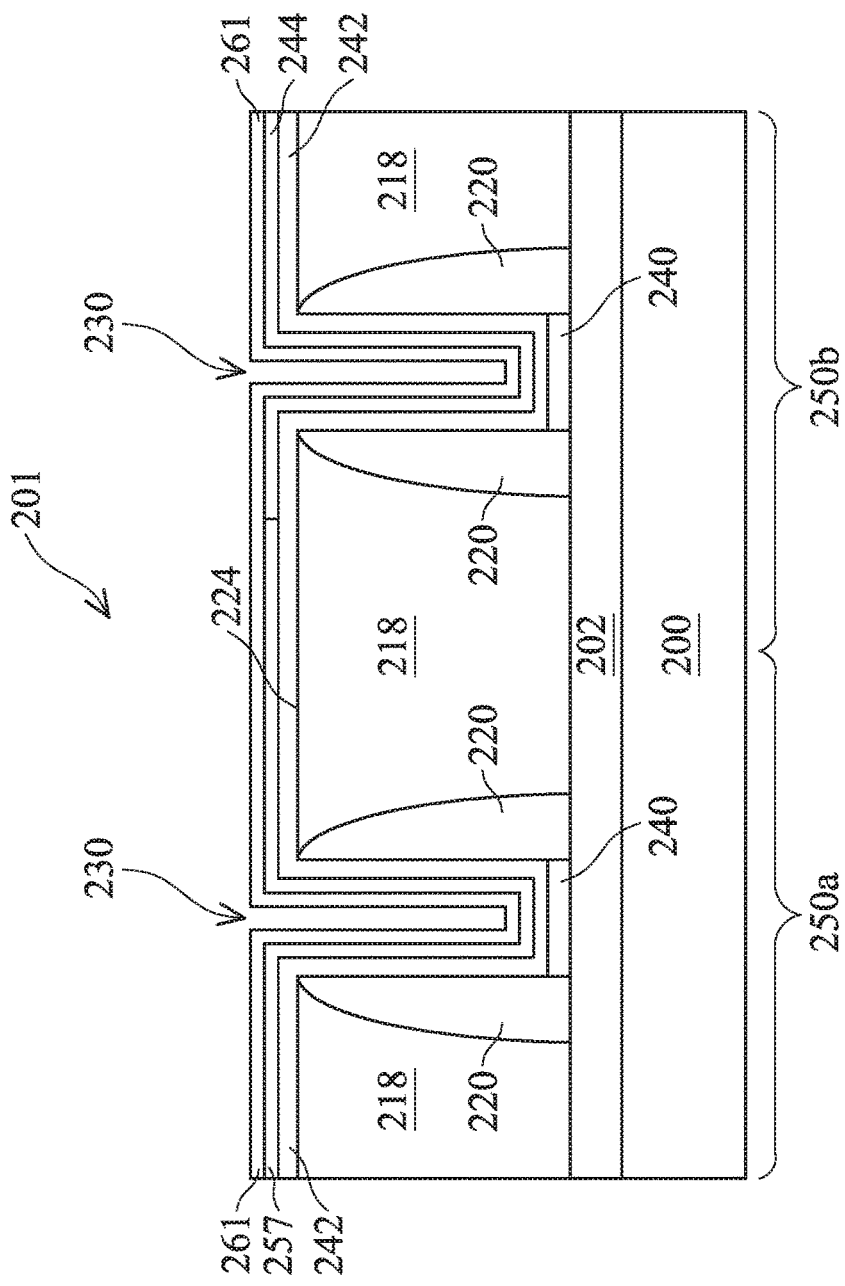
Figure 2J:
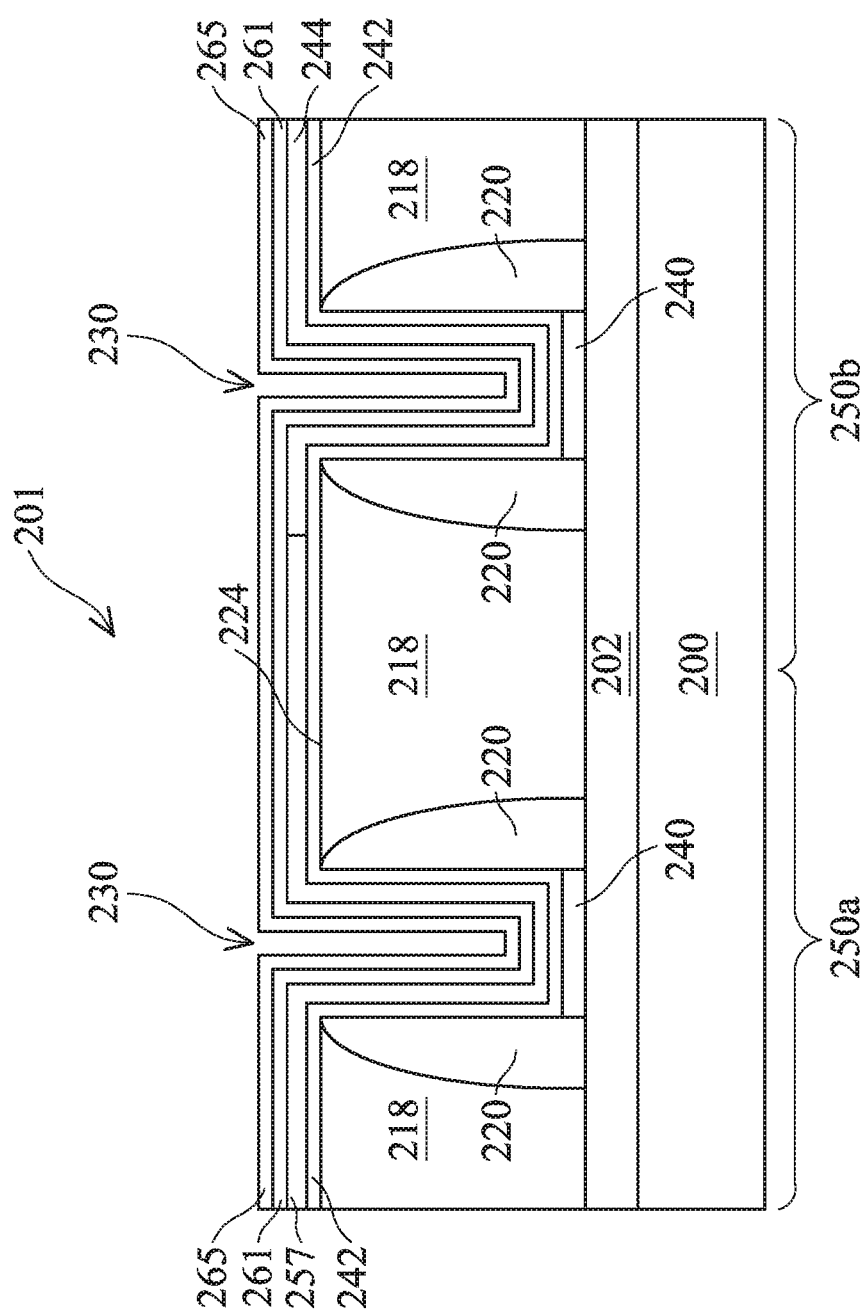
Figure 2K:
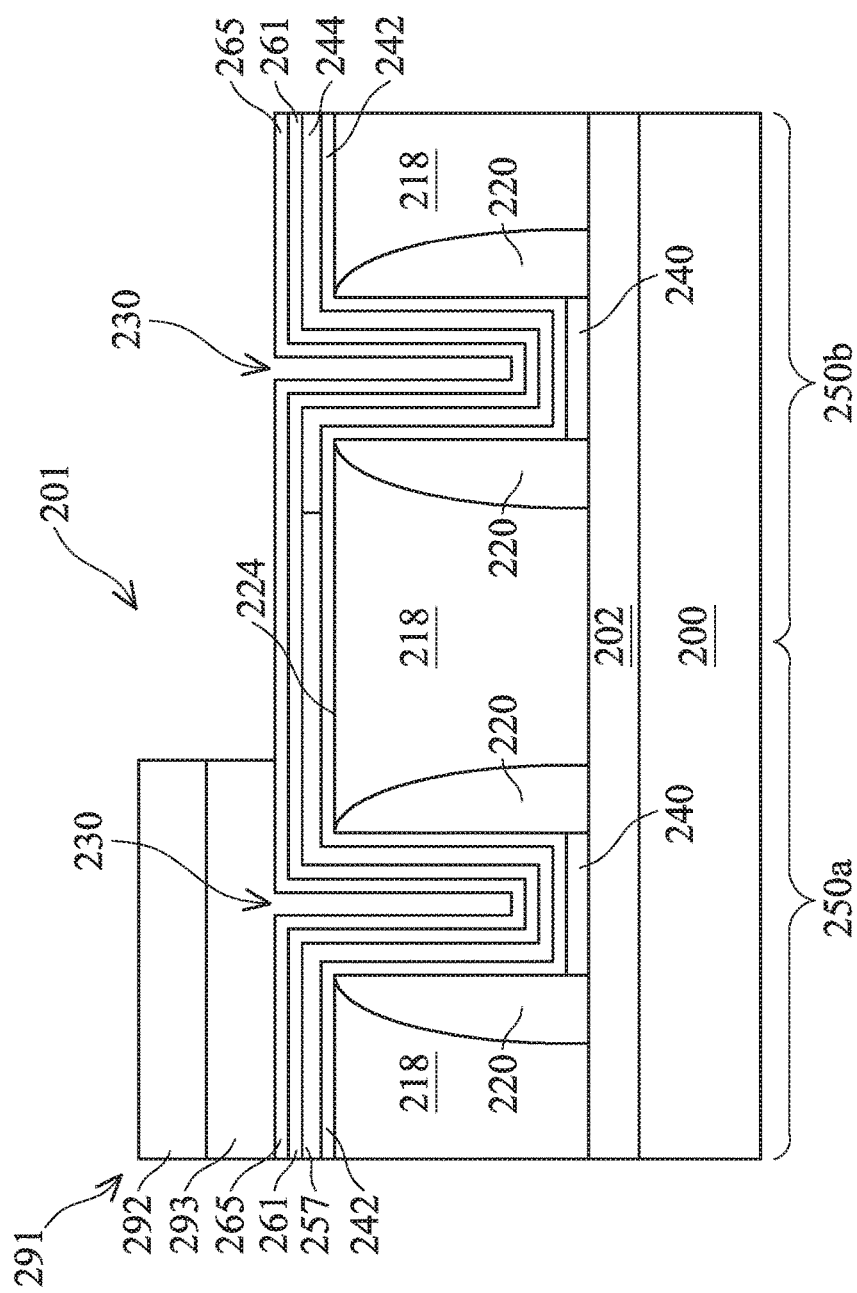
Figure 2L:
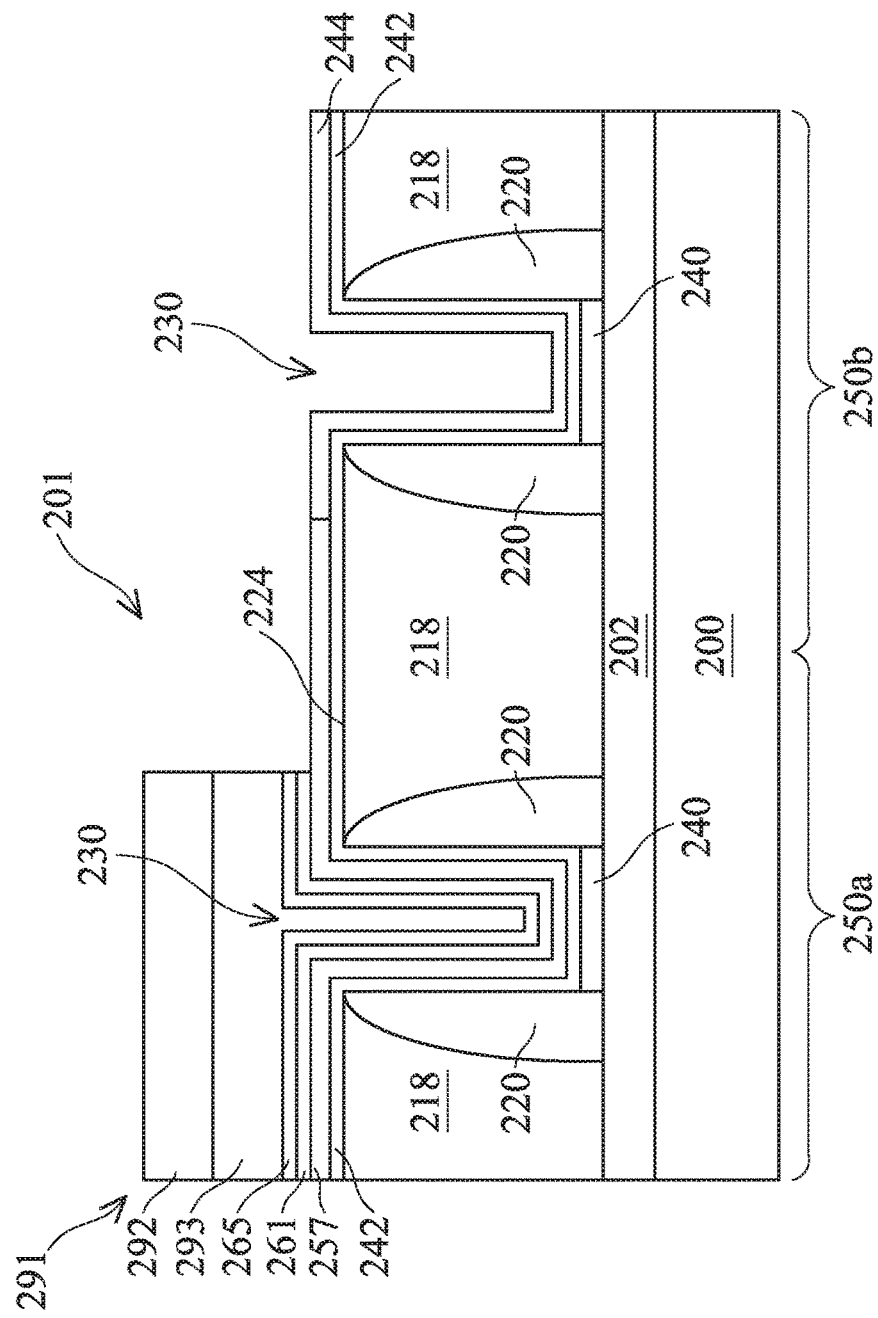
Figure 2M:
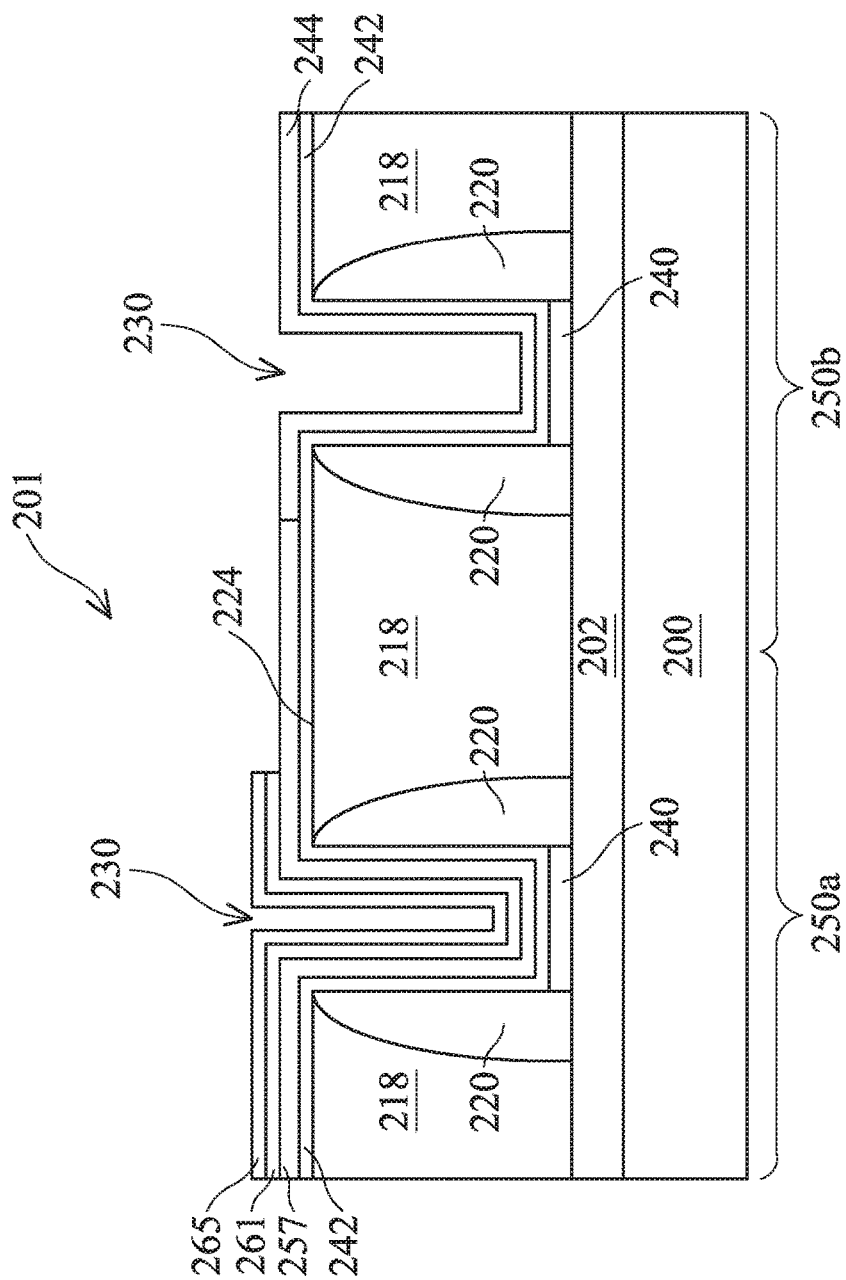
Figure 2N:
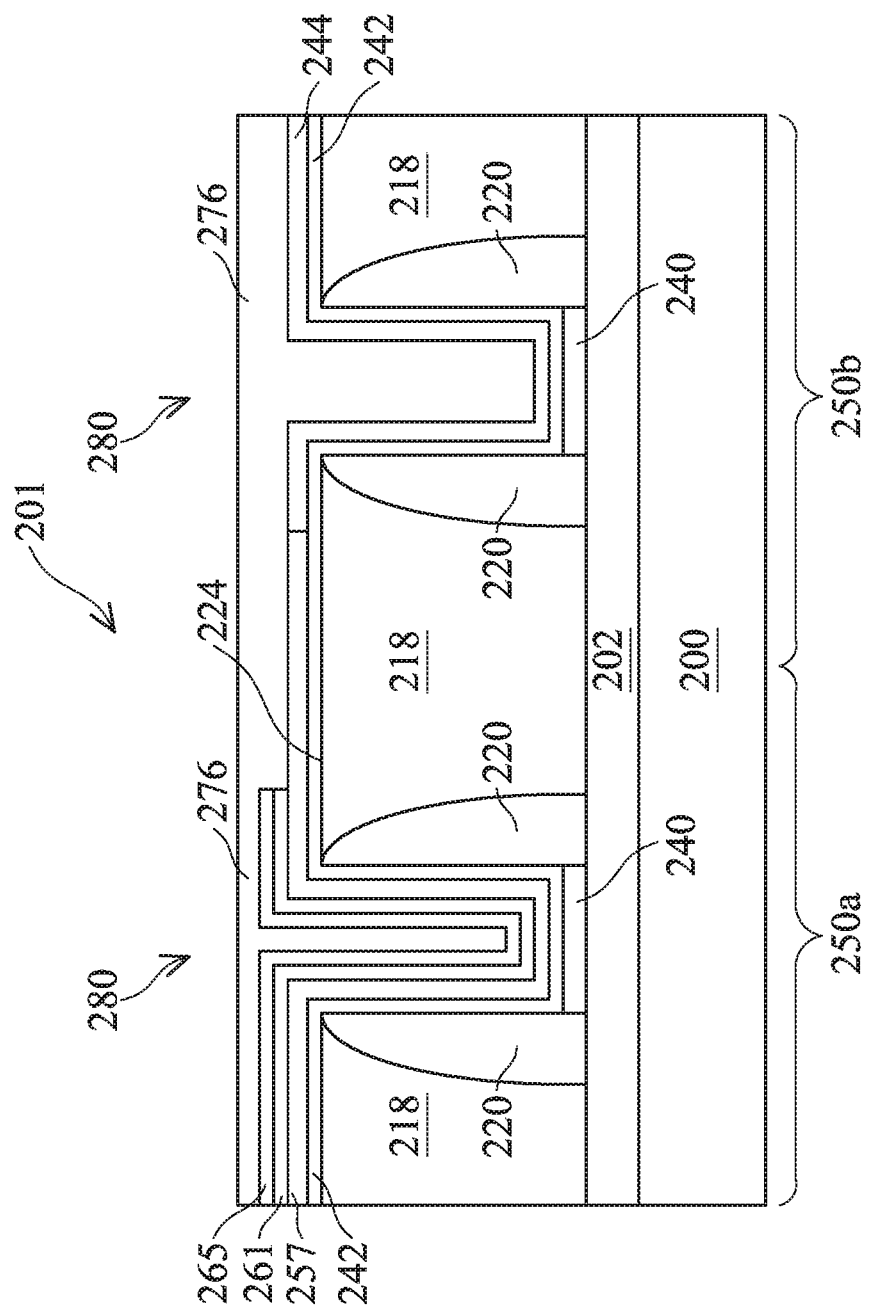
Figure 2O:
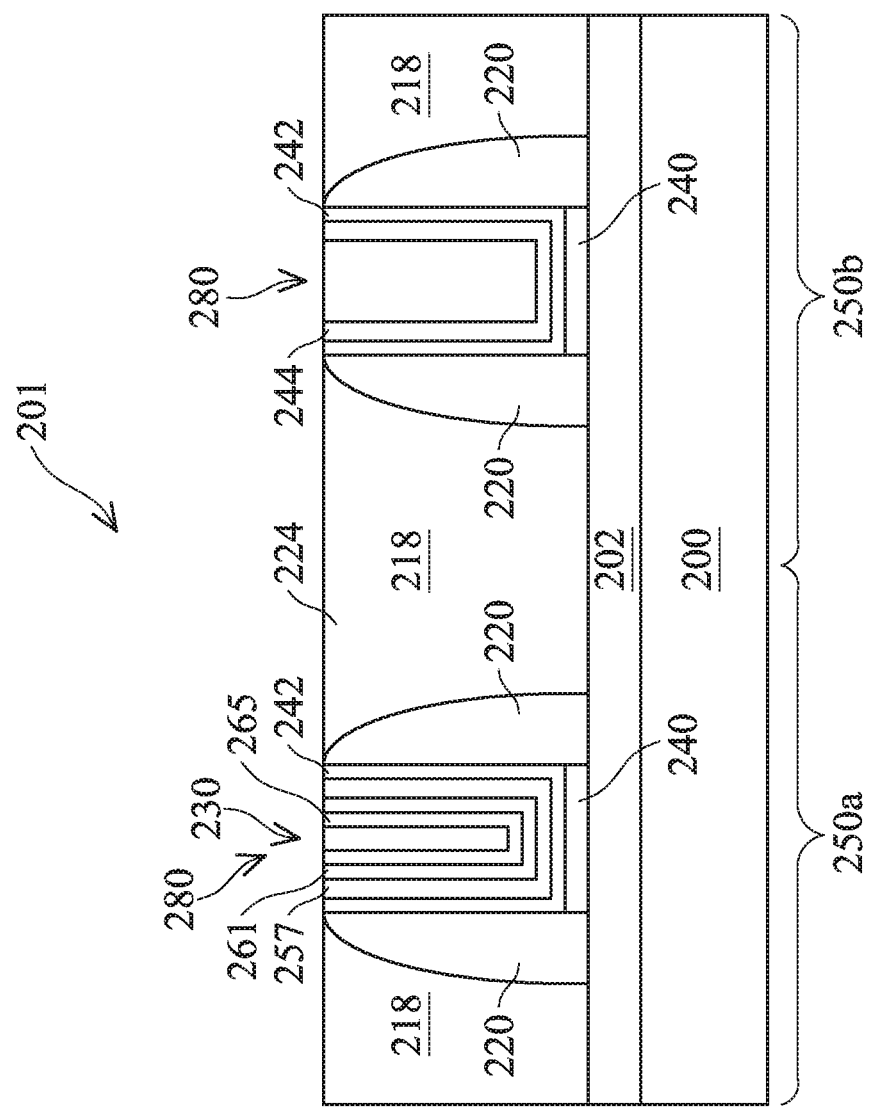

FIG. 1A-1B depicts an exemplary flow diagram of a process 100 performed to form a semiconductor device structure, such as the device structure 201 depicted in FIGS. 2A-2O. FIGS. 2A-2C1 are perspective views and FIGS. 2C2-2O are schematic cross-sectional views of a portion of the substrate corresponding to various stages of the process 100 in accordance with some embodiments. It is noted that the process 100 may be utilized to form any suitable structures, including the semiconductor device structure 201 depicted in FIGS. 2A-2O or other semiconductor structures not presented herein.

The process 100 begins at operation 102 by providing the substrate 200 having a plurality of fin structures 202 formed on the substrate 200, as shown in FIG. 2A.

The substrate 200 can be or include a bulk semiconductor substrate, a semiconductor-on-insulator (SOI) substrate, or another substrate. The semiconductor material of the substrate 200 can include or be a material selected from at least one of silicon (e.g., crystalline silicon like Si<100> or Si<111>), silicon germanium, germanium, gallium arsenide, or another semiconductor material. The semiconductor material may be doped or undoped, such as with a p-type or an n-type dopant. In some embodiments wherein a SOI structure is utilized for the substrate 200, the substrate 200 may include semiconductor material disposed on an insulator layer, which may be a buried insulator disposed in a semiconductor substrate, or which may be a glass or sapphire substrate. In embodiments depicted herein, the substrate 200 is a silicon containing material, such as a crystalline silicon substrate. Moreover, the substrate 200 is not limited to any particular size, shape, or materials. The substrate 200 may be a round/circular substrate having a 200 mm diameter, a 300 mm diameter, or other diameters, such as 450 mm, among others. The substrate 200 may also be any polygonal, square, rectangular, curved, or otherwise non-circular workpiece, such as a polygonal substrate as needed.

Each fin structure 202 provides an active region where one or more devices are formed. The fin structures 202 are fabricated using suitable processes including masking, photolithography, and/or etch processes. In an example, a mask layer is formed overlying the substrate 200. The photolithography process includes forming a photoresist layer (resist) overlying the mask layer, exposing the photoresist layer to a pattern, performing a post-exposure bake process, and developing the photoresist layer to pattern the photoresist layer. The pattern of the photoresist layer is transferred to the mask layer using a suitable etch process to form a masking element. The masking element may then be used to protect regions of the substrate 200 while an etch process forms recesses 214 into the substrate, leaving an extending fin, such as the fin structures 202. The recesses 214 may be etched using reactive ion etch (RIE) and/or other suitable processes. Numerous other embodiments of methods to form a fin structure on a substrate may be utilized.

In an embodiment, the fin structures 202 are approximately 10 nanometer (nm) wide and between approximately 10 nm and 60 nm in height, such as about 50 nm high. However, it should be understood that other dimensions may be used for the fin structures 202. In one example, the fin structures 202 comprise silicon materials or another elementary semiconductor, such as germanium, a compound semiconductor including silicon carbide, gallium arsenic, gallium phosphide, indium phosphide, indium arsenide, and/or indium antimonide. The fin structures 202 may also be an alloy semiconductor including SiGe, GaAsP, AlInAs, AlGaAs, GaInAs, GaInP, GaInAsP, or a combination thereof. Further, the fin structures 202 may be doped using n-type and/or p-type dopants as needed.

As described, in an example, the plurality of fin structures 202 may be formed by etching a portion of the substrate 200 away to form recesses 214 in the substrate 200. The recesses 214 may then be filled with isolating material that is recessed or etched back to form isolating structures 216. Other fabrication techniques for the isolation structures 216 and/or the fin structure 202 are possible. The isolation structures 216 may isolate some regions of the substrate 200, e.g., active areas in the fin structures 202. In an example, the isolation structures 216 may be shallow trench isolation (STI) structures and/or other suitable isolation structures. The STI structures may be formed of silicon oxide, silicon nitride, silicon oxynitride, fluoride-doped silicate glass (FSG), a low-k dielectric material, and/or other suitable insulating material. The STI structures may include a multi-layer structure, for example, having one or more liner layers.

A dummy gate structure 212 is formed over the fin structures 202. In the example depicted in FIG. 2A, the dummy gate structure 212 includes a gate dielectric layer 206, a dummy gate layer 208, and a hardmask layer 210. It is noted that the dummy gate structure 212 may further include a capping layer and/or other suitable layers. The various layers in the dummy gate structure 212 may be formed by suitable deposition techniques and patterned by suitable photolithography and etching techniques. The dummy gate structure 212 engages the fin structures 202 on two or three sides of the fin structure 202. The term, "dummy", as described here, refers to a sacrificial structure which will be removed in a later stage and will be replaced with an actual gate structure, such as a high-k metal gate structure, in a replacement gate process. The replacement gate process refers to manufacturing a gate structure at a later stage of the overall gate manufacturing process. The gate dielectric layer 206 can be a dielectric oxide layer. For example, the dielectric oxide layer may be formed by chemical oxidation, thermal oxidation, atomic layer deposition (ALD), chemical vapor deposition (CVD), and/or other suitable methods. The dummy gate layer 208 may be a poly-silicon layer or other suitable layers. For example, the dummy gate layer 208 may be formed by suitable deposition processes such as low-pressure chemical vapor deposition (LPCVD) and plasma-enhanced CVD (PECVD). The hardmask layer 210 may be any material suitable to pattern the dummy gate structure 212 with desired features/dimensions on the substrate.

In an embodiment, the various layers of the dummy gate structure 212 are first deposited as blanket layers. Then, the blanket layers are patterned through a process including photolithography and etching processes, removing portions of the blanket layers and keeping the remaining portions over the isolation structure 216 and the fin structures 202 to form the dummy gate structure 212.

In an example, the semiconductor device structure 201 includes a p-type device region 250a and an n-type device region 250b. One or more p-type devices, such as p-type FinFETs, may be formed in the p-type device region 250a, and one or more n-type devices, such as n-type FinFETs, may be formed in the n-type device region 250*b*. The semiconductor device 201 may be included in an IC such as a microprocessor, memory device, and/or other IC At operation 104, a spacer feature 220 is formed on sidewalls of the dummy gate structure 212 and an interlayer dielectric (ILD) 218 is then formed on the spacer feature 220, as shown in FIG. 2B. The spacer feature 220 includes a material different from the material(s) for the dummy gate structure 212. In an embodiment, the spacer feature 220 includes a dielectric material, such as silicon nitride or silicon oxynitride. In an example, the spacer feature 220 may be a single layer or multiple layers. In an embodiment, after the dummy gate structure 212 is formed, one or more spacer layers are formed by conformal depositing spacer materials over the device structure 201. Subsequently, an anisotropic etching process is performed to remove portions of the spacer layers to form the spacer feature 220, as depicted in FIG. 2B.

After the spacer feature 220 is formed, one or more epitaxial growth processes are performed to grow silicon features to form source/drain regions (not shown). The epitaxial growth process may in-situ dope the grown silicon with a p-type dopant for forming a p-type device region 250*a* or an n-type dopant for forming an n-type device region 250*b*.

Subsequently, the ILD 218 is formed over the substrate 200 and on the spacer feature 220. In some embodiments, the device 201 may further include a contact etch stop layer (not shown) underneath the ILD 218 and above the substrate 200 and spacer feature 220. The ILD 218 may include materials such as tetraethylorthosilicate (TEOS) oxide, un-doped silicate glass, doped silicon oxide such as borophosphosilicate glass (BPSG), fused silica glass (FSG), phosphosilicate glass (PSG), boron doped silicon glass (BSG), and/or other suitable dielectric materials. The ILD 218 may be deposited by a PECVD process, HDP-CVD process, or other suitable deposition technique. In an embodiment, the ILD 218 is formed by a CVD process to fill recesses 214. After various deposition processes, a chemical mechanical planarization (CMP) process is performed to planarize the ILD 218, defining a top surface 224 that is substantially coplanar with a top surface 222 of the dummy gate structure 212 exposed on the substrate 200 for subsequent fabrication steps, as shown in FIG. 2B.

At operation 106, the dummy gate structure 212 is removed from the substrate 200 to define an opening 230 in the ILD 218, as shown in FIG. 2C1. In the embodiment shown in FIG. 2C1, the opening 230 exposes a surface 232 of the isolation structures 216. FIG. 2C2 depicts a cross-sectional view cutting along the line A-A' including the opening 230 defined in the ILD 218 for ease of description of the device manufacturing process. The opening 230 allows a gate structure to be formed therein. Though the example depicted in FIG. 2C2 exposes a surface 233 of the fin structures 202, it is noted that the surface as exposed may also include different structures from the substrate, such as isolation structures 216, or other locations from the substrate 200.

The dummy gate structure 212 may be removed using etching processes. The etching processes may include a suitable wet etch, dry (plasma) etch, and/or other processes. For example, a dry etching process may use chlorine-containing gases, fluorine-containing gases, other etching gases, or a combination thereof. The wet etching solutions may include $NH_4OH$, HF (hydrofluoric acid) or diluted HF, deionized water, TMAH (tetramethylammonium hydroxide), other suitable wet etching solutions, or combinations thereof.

At operation 108, an interfacial layer 240, a gate dielectric layer 242 and a first work function metal 244 are sequentially formed in the opening 230 defined by the spacer feature 220, as shown in FIG. 2D. In an example, the interfacial layer 240 may include a dielectric material such as silicon oxide layer ($SiO_2$) or silicon oxynitride (SiON) and the like. The interfacial layer 240 may be formed by chemical oxidation, thermal oxidation, atomic layer deposition (ALD), CVD, and/or other suitable dielectric.

The gate dielectric layer 242 can include a high-k dielectric constant material such as hafnium oxide ($HfO_2$), $Al_2O_3$, lanthanide oxide ($LaO_2$), $TiO_2$, HfZrO, $Ta_2O_3$, $HfSiO_4$, $ZrO_2$, $ZrSiO_2$, combinations thereof, or other suitable material. The gate dielectric layer 242 may be formed by ALD and/or other suitable methods. It is noted that the gate dielectric layer 242 may be directly formed on the substrate 200 (e.g., on the fin structure 202) when the interfacial layer 240 is not present.

After the gate dielectric layer 242 is formed, the first work function metal 244 is formed on the gate dielectric layer 242. The first work function metal 244 is formed for tuning the work function of the device. The first work function metal 244 may be a p-type work function material for p-type FinFET devices in the p-type device region 250*a* or an n-type work function material for n-type FinFET devices in the n-type device region 250*b*. Suitable examples of the p-type work function material, which may have a work function ranging between 4.8 eV and 5.2 eV, includes TiN, TaN, Ru, Mo, Al, WN, $ZrSi_2$, $MoSi_2$, $TaSi_2$, $NiSi_2$, WN, other suitable p-type work function metal materials, or combinations thereof, and suitable examples of the n-type work function material, which may have a work function ranging between 3.9 eV and 4.3 eV, includes Ti, Ag, TaAl, TaAlC, HfAl, TiAl, TiAlN, TaC, TaCN, TaSiN, Mn, Zr, other suitable n-type work function metal materials, or combinations thereof.

A work function value is associated with the material composition of the first work function metal 244. The material of the first work function metal 244 is chosen to tune its work function value so that a desired threshold voltage (Vt) is achieved in the device that is to be formed in the respective region. The first work function metal 244 provides uniform threshold voltage (Vt). The first work function metal 244 may be deposited by CVD, ALD and/or other suitable process. In an example depicted herein, the first work function metal 244 is formed using an ALD process.

The thickness of the first work function metal layer 244 may be altered and adjusted by altering process parameters during the ALD deposition process, such as the deposition time, number of the pulses of precursors, pulse frequency, substrate temperature, pressure, and the like. In one example, the thickness of the first work function metal layer 244 is adjusted by altering the deposition time of the ALD process for depositing the first work function metal layer 244.

At operation 110, a first mask structure 248 is disposed on the n-type device region 250*b* and fills the opening 230 in the n-type device region 250*b* of the device structure 201 of the substrate 200, as shown in FIG. 2E. The first mask structure 248 covers the n-type device region 250*b* of the device structure 201, and exposes the p-type device region 250*a* of the device structure 201 for further etching. The first mask structure 248 serves as a mask during an etching/ patterning process so as to protect the structure covered by the first mask structure 248 from damage during the etching/patterning process.

The first mask structure 248 may include a photoresist 254 disposed on a bottom anti-reflective coating (BARC) 252. The photoresist 254 may be patterned by a photolithography process to have a desired dimension that may be utilized as a mask to transfer features onto the substrate 200. The BARC 252 may be an organic material coated onto the substrate 200 filling the openings 230 in the n-type device region 250b depicted in FIG. 2E. Although the example depicted in FIG. 2E shows that the first mask structure 248 is formed and filled in the openings 230 defined on the n-type device region 250b, it is noted that the first mask structure 248 may be formed at other portion of the substrate, such as the p-type device region 250a.

At operation 112, an etching process is performed to remove the first work function metal 244 from the opening 230 in the p-type device region 250a, depicted in FIG. 2F, of the substrate 200. The etching process may be a wet etching process performed by immersing or soaking the substrate 200 with an etching solution. In another example, a dry process, such as a vapor or a plasma process, is utilized to remove the first work function metal 244 in the p-type device region 250a. In yet another example, a combination of wet and dry process is utilized to remove the first work function metal 244 in the p-type device region 250a. In a specific example, removing the first work function metal 244 from the openings 230 in the p-type device region 250a at operation 112 is a wet process performed by dipping, immersing, or soaking the substrate with or in an etching solution in a wet tank. The etching solution may be an alkaline, neutral or acid solution with a pH value in a predetermined range. Selection of the etching solution is based on the material types of the first work function metal 244 to be removed from the substrate 200.

In an embodiment, the etching solution includes phosphoric acid (or orthophosphoric acid), such as 85 weight percent (85 wt. %) of $H_3PO_4$ in an aqueous solution (e.g., $H_2O$). To further this embodiment, the etching solution may include a mixture of phosphoric acid with other components such as hydrogen peroxide ($H_2O_2$). Other etchants, such as hydrofluoric acid (HF), hydrochloric acid (HCl), and/or sulfuric acid ($H_2SO_4$), may also be utilized. In an example, the ratio of phosphoric acid in the DI water of the etching solution is about 1:5 to about 1:50.

In an example, the etching solution is an acid solution that reacts with the materials from the first work function metal 244. The acid solution etches the first work function metal 244, e.g., a metal containing material. Other etchants, such as hydrofluoric acid (HF), hydrochloric acid (HCl), and/or sulfuric acid ($H_2SO_4$), may be added to provide different pH levels for a given concentration. These etchants may be utilized to maintain a desired level of pH value and/or to assist dissociation of the chemical compounds dissolved in the etching solution. The pH value of the etching solution can be controlled at less than or about 6, such as less than 4, or more particularly, for example, less than 2. In a specific example, the pH value of the etching solution is less than 1. In an example, the etching process may be maintained at a temperature in a range of about 20 to about 80 degrees Celsius.

At operation 114, upon the removal of the first work function metal 244 in the p-type device region 250a, a self-protective layer 257 is simultaneously formed on the gate dielectric layer 242 when the etching solution encounters a surface 256 of the gate dielectric layer 242, as shown in FIG. 2G. The self-protective layer 257 is formed on the surface 256 (including surfaces of bottom portions and sidewall portions) of the gate dielectric layer 242 as a result of phosphoric acid chelating. The metal element, such as Hf, Zr or Ta, and the like, from the high dielectric constant material selected for the gate dielectric layer 242 reacts with the phosphorus element from the phosphoric acid to form the self-protective layer 257. The self-protective layer includes metal phosphate, such as metal containing phosphoric acid chelating or metal containing complexing agents, to protect the surface 256 of the gate dielectric layer 242 from being further etched. When the surface 256 of the gate dielectric layer 242 is exposed, the metal element embedded in the gate dielectric layer 242 is also simultaneously exposed, triggering the chemical reaction between the metal elements embedded in the gate dielectric layer 242 and the phosphorus elements from the phosphoric acid to form metal phosphate as the self-protective layer 257. Some of the metal elements of the metal phosphate are embedded in the gate dielectric layer 242 while some of the metal elements of the metal phosphate are formed as the self-protective layer 257. The self-protective layer 257 further prevents the phosphoric acid from penetrating and etching the gate dielectric layer 242.

Figure 3A:
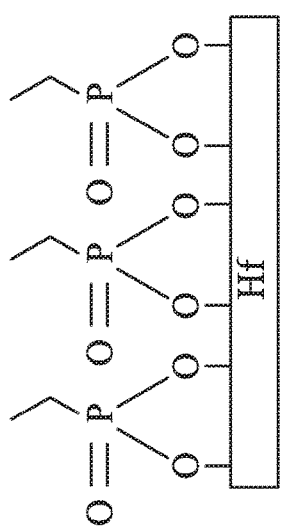
FIGS. 3A-3C depict different examples of surface structure reactions during the metal patterning processes depicted in FIG. 1A-1B.

In one example, the gate dielectric layer 242 includes an Hf element, such as $HfO_2$ or $HfSiO_4$ or other Hf containing dielectrics. The Hf element reacts with the etching solution to form Hf containing phosphoric acid chelating or Hf containing phosphate (or called Hf containing complexing agents) by forming a phosphate metal linkage (P—Hf leakage), as shown in FIG. 3A. The phosphate head group may be coordinated onto the Hf element containing surface from the gate dielectric layer 242, forming mono-dentate and bi-dentate complexes to protect the gate dielectric layer 242. The phosphate metal linkage formed in the high dielectric constant material from the gate dielectric 242 provides a good bonding at the interface, joining the self-protective layer 257 onto the gate dielectric layer 242.

Figure 3B:
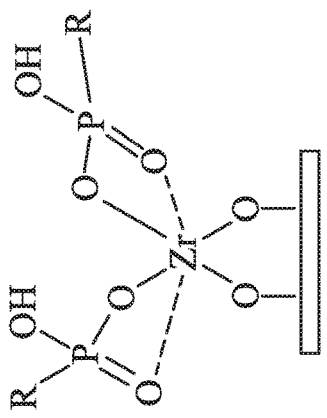
Figure 3C:
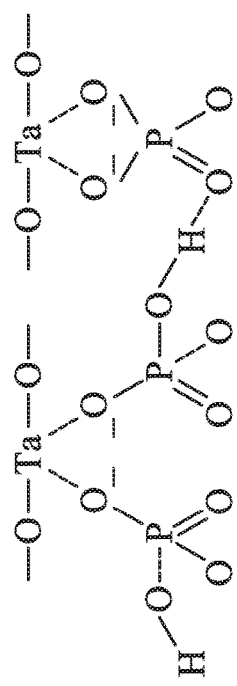

Similarly, in another example, the gate dielectric layer 242 includes Zr, or Ta element such as $ZrO_2$, $Ta_2O_5$, or other Zr or Ta containing dielectrics. The metal element reacts with the etching solution to form Zr or Ta containing phosphoric acid chelating or Zr or Ta containing phosphate (or called Zr or Ta containing complexing agents), as shown in FIGS. 3B and 3C respectively, by forming phosphate metal linkage (P—Zr or P—Ta leakage). The phosphate head group may be coordinated onto the Zr or Ta element containing surface from the gate dielectric layer 242, forming mono-dentate and bi-dentate complexes to protect the gate dielectric layer 242.

As shown in FIG. 2G, as a result of the bonding of the gate dielectric layer 242 with components from the etching solution, the self-protective layer 257 is formed on the gate dielectric layer 242 when the surfaces 256 (including surfaces of bottom portions and sidewall portions) of the gate dielectric layer 242 are exposed. In turn, formation of the self-protective layer 257 causes the etching of the first work function metal 244 in the openings 230 to automatically stop at the gate dielectric layer 242. Because the metal element from the self-protective layer 257 is sourced from the metal element from the gate dielectric layer 242, the gate dielectric layer 242 and the self-protective layer 257 have a common metal element formed therein. The common metal element may be Ta, Ti, Hf, Zr, or a combination thereof, or any suitable materials selected to fabricate the metal dielectric material for the gate dielectric layer 242.

After the self-protective layer 257 is formed, the substrate 200 may be removed from the etching solution. A rinse process may be performed to remove etching residues, such as phosphate monolayers, from the opening 230. For example, the rinse process may use a solution containing DI water, carbonized DI water, such as DI water with carbon dioxide, or DI water with $NH_4OH$. The rinse process may be performed at a temperature in a range of about 20 to about 80 degrees Celsius. Furthermore, a drying process may also be performed to dry the surface of the substrate 200. For example, the drying process may include a spin drying of the substrate 200 in the presence of a flow of nitrogen. For example, the drying process may include an isoprophyl alcohol (IPA) drying process.

At operation 116, after the self-protective layer 257 is formed in the p-type device region 250a, the first mask structure 248 is then removed from the n-type device region 250b of the device structure 201, as shown in FIG. 2H. After the first mask structure 248 is removed, the first work function metal 244 is exposed in the n-type device region 250b as well as the self-protective layer 257 formed in the p-type device region 250a.

At operation 118, an optional metal barrier layer 261 may be conformally formed on the self-protective layer 257, as shown in FIG. 2I. As discussed above, when the metal element from the gate dielectric layer 242 encounters the phosphorus element from the phosphoric acid, a chemical reaction occurs to form the self-protective layer 257 comprising phosphoric acid chelating. Similarly, the material of the optional metal barrier layer 261 is also selected to include a metal element that can react with the phosphorus element from the phosphoric acid chelating in the self-protective layer 257 to form a bond with good adhesion for good interface control. The metal barrier layer 261 formed may provide a wider process window that may assist with tuning work function value for the metal gate structure, which will be formed and completed in the opening 230 defined in the ILD 218. Tuning of the work function value helps achieve a desired threshold voltage (Vt) in the device that is to be formed in the respective region. Thus, by forming the metal barrier layer 261, optionally, in the openings 230, which later will be formed as a part of the metal gate structure, more selections of the film scheme utilized to form the metal gate structure may be obtained, so that the work function value of the metal gate structure may be more flexibly adjusted or maintained.

In an example, the metal barrier layer 261 formed on the self-protective layer 257 is a Ta containing layer. As discussed previously with reference to FIG. 3C, the phosphorus element has a relatively strong bonding energy with the Ta element. Thus, the metal barrier layer 261 containing Ta elements provides an interface with strong bonding, comprising Ta containing phosphoric acid chelating following the similar reaction mechanism depicted in FIG. 3C, between the metal barrier layer 261 and the self-protective layer 257 and/or the gate dielectric layer 242. The metal barrier layer 261 with the Ta element may also assist sealing the self-protective layer 257 more securely between the gate dielectric layer 242 and the metal barrier layer 261 to provide good interface control and adhesion management. It is noted that other metal dielectrics containing metal elements which may react and form a bonding with the phosphorus element may also be utilized to form the metal barrier layer 261. Suitable examples of the metal barrier layer 261 include Ta containing layers, Ti containing layers, and the like. In an example, the metal barrier layer 261 is selected from $Ta_2O_5$, TaSiON, TaSiO, TiN, TiON, TiO, TiSiO, and the like. The metal barrier layer 261 may be deposited by CVD, ALD and/or other suitable process. In one example depicted herein, the metal barrier layer 261 is formed using an ALD process.

At operation 120, after the optional metal barrier layer 261 is formed in the opening 230, a second work function metal 265 is conformally formed on the optional metal barrier layer 261, as shown in FIG. 2J. The material selected to fabricate the second work function metal 265, which will remain in the p-type device region 250a after multiple patterning process, may be different from the first work function metal 244 existing on the n-type device region 250b of the substrate 200.

As discussed above, a work function value is associated with the material composition of the first work function metal 244 and the second work function metal 265. By utilizing different materials to fabricate the first and the second work function metals 244, 265 in different device regions of the substrate 200 (e.g., p-type and n-type device regions 250a and 250b), the work function value of the metal gate structure may be more flexibly adjusted and tuned as needed. Suitable examples of the p-type work function metal materials, which may have a work function ranging between 4.8 eV and 5.2 eV, include TiN, TaN, Ru, Mo, Al, WN, $ZrSi_2$, $MoSi_2$, $TaSi_2$, $NiSi_2$, WN, other suitable p-type work function metal materials, or combinations thereof, and suitable examples of the n-type work function metal materials, which may have a work function ranging between 3.9 eV and 4.3 eV, include Ti, Ag, TaAl, TaAlC, HfAl, TiAl, TiAlN, TaC, TaCN, TaSiN, Mn, Zr, other suitable n-type work function metal materials, or combinations thereof.

The second work function metal 265 may be deposited by CVD, ALD and/or other suitable process.

In an example depicted herein, the second work function metal 265 is formed using an ALD process. The thickness of the second work function metal 265 may be altered and adjusted by altering process parameters during the ALD deposition process, such as the deposition time, number of the pulses of precursors, pulse frequency, substrate temperature, pressure, and the like. In one example, the thickness of the second work function metal layer 265 is adjusted by altering the deposition time of the ALD process for depositing the second work function metal layer 265.

At operation 122, after the second work function metal 265 is formed, a second mask structure 291 is disposed on the p-type device region 250a and fills the opening 230 in the p-type device region 250a of the device structure 201 of the substrate 200, as shown in FIG. 2K. The second mask structure 291 covers the p-type device region 250a of the device structure 201, and exposes the n-type device region 250b of the device structure 201 for further etching. The second mask structure 291 serves as a mask during an etching/patterning process so as to protect the structure covered by the second mask structure 248 from damage during the etching/patterning process.

Similar to the first mask structure 248 described above, the second mask structure 291 may include a photoresist 292 disposed on a bottom anti-reflective coating (BARC) 293. The photoresist 292 may be patterned by a photolithography process to have a desired dimension that may be utilized as a mask to transfer features onto the substrate 200. The BARC 293 may be an organic material coated onto the substrate 200 filling the openings 230 in the p-type device region 250a depicted in FIG. 2K. It is noted that the first mask structure 248 and the second mask structure 291 are formed at different stages of the process to etch layers at different regions of the substrate so as to form different film scheme at different regions of the substrate for different device performance requirement and adjustment.

At operation 124, an etching process is performed to remove the second work function metal 265 and the optional metal barrier layer 261 from the n-type device region 250b, depicted in FIG. 2L, of the substrate 200. The etching process may be a wet etching process performed by immersing or soaking the substrate 200 with an etching solution. In another example, a dry process, such as a vapor or a plasma process, is utilized to remove the second work function metal 265 and the optional metal barrier layer 261 in the n-type device region 250b. In yet another example, a combination of wet and dry process is utilized to remove the second work function metal 265 and the optional metal barrier layer 261 in the n-type device region 250b as needed. In a specific example, removing the second work function metal 265 and the optional metal barrier layer 261 in the n-type device region 250b at operation 124 is a wet process performed by dipping, immersing, or soaking the substrate with or in an etching solution in a wet tank. The etching solution may be an alkaline, neutral or acid solution with a pH value in a predetermined range. Selection of the etching solution is based on the material types of the second work function metal 265 and the optional metal barrier layer 261 to be removed from the substrate 200.

At operation 126, after the second work function metal 265 and the optional metal barrier layer 261 are removed from the n-type device region 250b, the second mask structure 291 is then removed from the p-type device region 250a of the device structure 201, as shown in FIG. 2M. After the second mask structure 291 is removed, the second work function metal 265 is exposed in the p-type device region 250a as well as the first work function metal 244 formed in n-type device region 250b.

Thus, the film scheme (e.g., the gate dielectric layer 242, the self-protective layer 257, the optional metal barrier 261 and the second work function metal layer 265) formed in the p-type device region 250a is configured to be different from the film scheme (e.g., the gate dielectric layer 242 and the first work function metal layer 244) formed in the n-type device region 250b of the substrate 200. By utilizing different film schemes, different materials for different structures in different regions, e.g., the p-type or n-type device regions 250a, 250b, of the device structure 201, the work function value or the other associated electrical performance of the metal gate structure formed at the device structure 201 may be flexibly and efficiently adjusted and enhanced.

Furthermore, by forming the self-protective layer 257 at the interface between the gate dielectric layer 242 and the second work function metal layer 265 (or the optional metal barrier 261), a good interface control as well as electrical performance enhancement and adjustment may be obtained and achieved.

At operation 128, after the second mask structure 291 is removed from the substrate 200, a gate electrode metal 276 is filled in the openings 230 defined in the ILD layer 218 to complete the metal gate structure 280, as shown in FIG. 2N. The gate electrode metal 276 may also be called a metal filling layer that is formed by CVD, PVD, plating, and/or other suitable processes. The gate electrode metal 276 may include Al, W, or Cu and/or other suitable materials. In one example, a liner layer (not shown), such as TiN, TaN, TiON, TaON and the like, may be formed on the substrate prior to forming the gate electrode metal 276.

At operation 130, a CMP process may be performed to remove excess materials from the metal gate structure 280 so as to planarize a top surface of the device 201, as shown in FIG. 2O.

Although not intended to be limiting, one or more embodiments of the present disclosure provide many benefits to a semiconductor device and the formation thereof. For example, embodiments of the present disclosure provide methods for patterning work function metal layer(s) in a replacement gate process. According to the present disclosure, an etching solution including phosphoric acid (or orthophosphoric acid), along with hydrogen peroxide, in an acid based solution can be utilized to pattern the work function metal. Upon removal of the work function metal from the substrate and once the underlying gate dielectric layer is exposed, a self-protective layer can be formed over the gate dielectric layer to terminate the patterning process. As a result, the self-protective layer may retain its blocking and bridging capability so as to form film structures with different variations at different locations of the devices to enhance the electrical performance. Additionally, an optional metal barrier may be formed on the self-protective layer prior to forming the work function metal to provide a flexible turning feature at the interface so as to provide the devices with different work function values. The patterning process utilizing the etchant comprising phosphoric acid may be performed in any existing wet etching tool.

In one example, a semiconductor device includes a first gate structure and a second gate structure formed on a substrate, wherein the first gate structure includes a first work function metal having a first material, and the second gate structure includes a second work function metal having a second material, the first material being different from the second material, wherein the first gate structure further includes a gate dielectric layer, a self-protective layer having metal phosphate, and the first work function metal on the self-protective layer.

In another embodiment, a semiconductor device includes a gate structure formed on a substrate, wherein the gate structure includes a gate dielectric layer, a self-protective layer comprising metal phosphate on the gate dielectric layer, wherein the metal phosphate has a common metal element with the gate dielectric layer, and a work function metal formed on the self-protective layer.

In yet another embodiment, a method for forming a semiconductor device includes patterning a first work function metal on a gate dielectric layer disposed on a substrate using an etching solution, wherein the etching solution includes phosphoric acid and hydrogen peroxide in an acid solution, and upon removal of the first work function metal from the substrate, forming a self-protective layer on the gate dielectric layer by exposing the gate dielectric layer to the etching solution.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device, comprising:
a first gate structure and a second gate structure formed on a substrate; wherein the first gate structure includes a first work function metal having a first material, and the second gate structure includes a second work function metal having a second material, the first material being different from the second material, wherein the first gate structure further comprises:
a gate dielectric layer;
a self-protective layer having metal phosphate; and
the first work function metal on the self-protective layer.

2. The semiconductor device of claim 1, wherein the first gate structure further comprises:
a metal barrier between the self-protective layer and the first work function metal.

3. The semiconductor device of claim 2, wherein the metal barrier is a Ta containing layer.

4. The semiconductor device of claim 3, wherein the metal barrier and the self-protective layer form Ta containing phosphate linkage at an interface therebetween.

5. The semiconductor device of claim 1, further comprising:
a gate electrode metal on the first work function metal.

6. The semiconductor device of claim 1, wherein a metal element from the metal phosphate is embedded in the gate dielectric layer.

7. The semiconductor device of claim 1, wherein the gate dielectric layer and the self-protective layer share a common metal element.

8. The semiconductor device of claim 7, wherein the common metal element is at least one of Ta, Ti, Hf, Zr, or a combination thereof.

9. The semiconductor device of claim 1, wherein the gate dielectric layer is a high dielectric constant material selected from at least one of hafnium oxide ($HfO_2$), $Al_2O_3$, lanthanide oxide ($LaO_2$), $TiO_2$, HfZrO, $Ta_2O_3$, $HfSiO_4$, $ZrO_2$, $ZrSiO_2$ or a combination thereof.

10. The semiconductor device of claim 1, wherein the first gate structure further includes an interfacial layer under the gate dielectric layer.

11. The semiconductor device of claim 1, wherein the first work function metal is utilized for a p-type FinFET and the second work function metal is utilized for a p-type FinFET.

12. A semiconductor device structure, comprising:
a gate structure formed on a substrate, wherein the gate structure comprises:
a gate dielectric layer;
a self-protective layer comprising metal phosphate on the gate dielectric layer, wherein the metal phosphate has a common metal element with the gate dielectric layer; and
a work function metal formed on the self-protective layer.

13. The semiconductor device of claim 12, wherein the common metal element is at least one of Ta, Ti, Hf, Zr, or a combination thereof.

14. The semiconductor device of claim 12, further comprising:
a metal barrier on the self-protective layer, wherein the metal barrier is bonded with the metal phosphate from the self-protective layer.

15. The semiconductor device of claim 14, wherein the metal barrier is a Ta containing material.

16. A semiconductor device structure, comprising:
a substrate;
a gate dielectric layer over the substrate, the gate dielectric comprising a compound including a first metal element;
a self-protective layer on the gate dielectric, the self-protective layer comprising a metal phosphate, the metal phosphate including the first metal element; and
a conductive material over the self-protective layer.

17. The semiconductor device structure of claim 16, wherein the conductive material comprises:
a work function metal on the self-protective layer; and
a metal fill on the work function metal.

18. The semiconductor device structure of claim 17, further comprising a barrier layer interposed between the self-protective layer and the work function metal.

19. The semiconductor device structure of claim 18, wherein the barrier layer comprises a Ta-containing layer or a Ti-containing layer.

20. The semiconductor device structure of claim 16, wherein the first metal element comprises Ta, Ti, Hf, or Zr.

* * * * *